United States Patent [19]

Chang et al.

[11] 4,005,469
[45] Jan. 25, 1977

[54] P-TYPE-EPITAXIAL-BASE TRANSISTOR WITH BASE-COLLECTOR SCHOTTKY DIODE CLAMP

[75] Inventors: Augustine Wei-Chun Chang, Wappingers Falls; Vincent Joseph Lucarini, Pleasant Valley, both of N.Y.

[73] Assignee: International Business Machines Corporation, Armonk, N.Y.

[22] Filed: June 20, 1975

[21] Appl. No.: 588,918

[52] U.S. Cl. .................................. 357/15; 357/35; 357/49
[51] Int. Cl.² ................. H01L 29/48; H01L 29/56; H01L 29/64; H01L 29/72
[58] Field of Search ................. 357/49, 35, 15

[56] References Cited
UNITED STATES PATENTS

| | | | |
|---|---|---|---|
| 3,463,975 | 8/1969 | Biard | 357/15 |
| 3,506,893 | 4/1970 | Dhaka | 357/15 |
| 3,699,362 | 10/1972 | Jordan | 357/15 |
| 3,861,968 | 1/1975 | Magdo et al. | 357/23 |
| 3,878,552 | 4/1975 | Rodgers | 357/15 |

*Primary Examiner*—Andrew J. James
*Attorney, Agent, or Firm*—Robert J. Haase

[57] ABSTRACT

A clamped epi-base NPN transistor with very short saturation time constant is obtained by ion implantation in the P-type base region to convert a portion thereof to N⁻ conductivity type contiguous to the collector reach-through region. The converted region is contacted by an extended metal electrode which also contacts the base region. The metal electrode establishes ohmic contact to the base region and Schottky diode contact to the converted region and to the collector region connected thereto.

7 Claims, 3 Drawing Figures

P-TYPE-EPITAXIAL-BASE TRANSISTOR WITH BASE-COLLECTOR SCHOTTKY DIODE CLAMP

BACKGROUND OF THE INVENTION

As is well understood, a clamped transistor is one which includes an external diode connected between the base and collector. The external diode is poled in the same direction as the internal base-to-collector diode of the transistor. The external diode is characterized by a forward voltage drop much lower than the forward voltage which would turn "on" the internal base-to-collector diode of the transistor. Thus, in the saturation region of the transistor when the collector junction becomes forward biased, most of the excess base current which otherwise would flow directly into the base and collector of the transistor is shunted around the transistor collector region through the path provided by the external diode. Inasmuch as minority carriers are not stored in the external diode, the shunting of the excess base current significantly reduces the stored charges in the transistor thus decreasing the saturation time constant of the transistor.

In the case of NPN transistors having a collector formed in $N^-$ substrate material, a Schottky diode clamp is readily obtained by forming an extended base contact which bridges over the junction edge between the base and collector regions. The extended electrode makes ohmic contact to the P base region and Schottky diode contact to the $N^-$ collector region as is desired. Such a simple solution to the problem of forming a clamped transistor is not feasible in the case of a planar P-type epitaxial-base transistor which has no $N^-$ collector region. The latter transistor is characterized by a heavily N-doped collector reach-through region contiguous to the P epi-base region on the planar surface of the transistor. An extended electrode bridging the base and collector reach-through regions would merely form ohmic contacts with both regions thus shorting out the collector-base junction.

SUMMARY OF THE INVENTION

A Schottky diode clamp is added to a P epi-base transistor by the single additional process step of selectively converting a portion of the P epi-base region to $N^-$ conductivity type contiguous to the collector reach-through region. Ohmic contact is established to the unconverted base region while Schottky diode contact is established to the converted portion of the base region and the collector region by a single extended metal electrode which bridges across the junction between the converted base region and the unconverted base region.

DESCRIPTION OF THE PREFERRED EMBODIMENT

Figure 1:
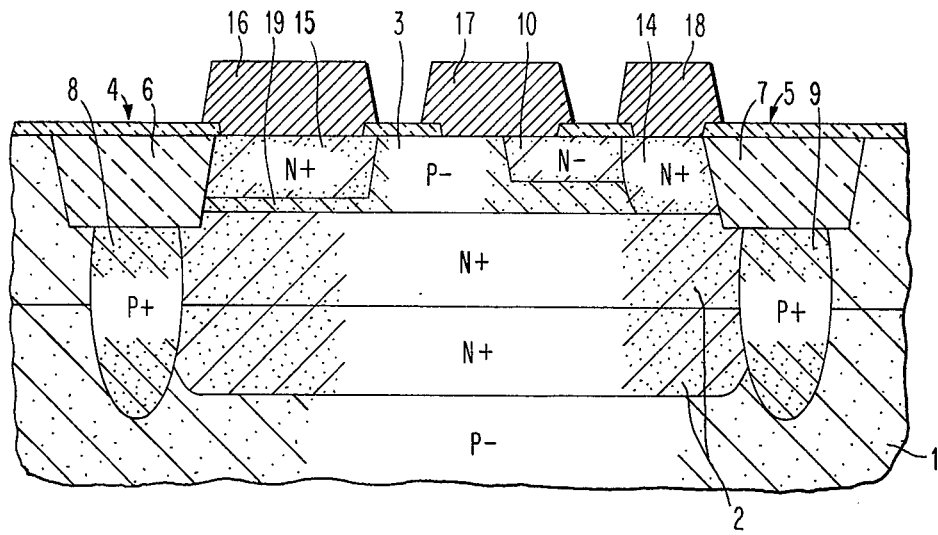
FIG. 1 is a simplified cross-sectional view of a preferred embodiment to the present invention.

The P epi-base transistor of FIG. 1 comprises a $P^-$ substrate 1 having an impurity concentration in the range from about $10^{14}$ to $10^{15}$ atoms per cubic centimeter and a resistivity of about 10 to 25 ohm centimeters.

The $N^+$ subcollector 2 is diffused into substrate 1 with a surface concentration of about $4 \times 10^{20}$ atoms per cubic centimeter to produce a sheet resistivity of about 5 ohms per square. The subcollector diffusion is accomplished using an apertured silicon dioxide diffusion mask (not shown) in a conventional manner. After the diffusion has been completed, the oxide mask is removed and $P^-$ epitaxial layer 3 is grown to a depth of about 2 micron over substrate 1 and over subcollector 2. Layer 3 preferably has an impurity concentration of about $10^{16}$ atoms per cubic centimeter.

In the preferred embodiment, recessed dielectric isolation is employed which, in conjunction with buried subcollector 2, isolates a region of the $P^-$ epitaxial layer within which the clamped P epi-base transistor of the present invention is to be formed. Accordingly, successive layers of thermally grown silicon dioxide, silicon nitride and pyrolytic silicon dioxide (not shown) are placed over the top surface of epitaxial layer 3. Said layers are apertured in regions 4 and 5 by conventional photolithography and chemical etching steps to produce a mask for recessed oxide isolation 6 and 7. It is to be understood, of course, that the recessed oxide completely surrounds the isolated region within which the clamped P epi-base transistor is to be formed although only the two oxide portions 4 and 5 appear in the cross-sectional view of FIG. 1. After the apertures are placed in regions 4 and 5 of the recessed oxidation mask (not shown), a P type impurity of high concentration is deposited in the window areas 4 and 5 and the structure is then subjected to a recessed oxidation step to provide about 10,000 angstroms of silicon dioxide 6 and 7 on top of $P^+$ regions 8 and 9, respectively. $P^+$ regions 8 and 9 are introduced to assure effective isolation underneath recessed oxide regions 6 and 7 by eliminating the possibility of inversion of the $P^-$ substrate material which would occur if the recessed oxide were allowed to directly contact the $P^-$ substrate material.

The process steps and the resulting structure to the extent described above follow state-of-the-art techniques. The next step departs from said techniques in order to provide ion implanted $N^-$ region 10 which is to be used both for the formation of a Schottky diode and for the ohmic connection of the negative pole of said diode to subcollector area 2. This step can be better understood by reference to FIG. 2 which shows the partial structure of FIG. 1 upon the conclusion of the ion implantation forming $N^-$ region 10. The previously described pyrolytic oxide and silicon nitride masking layers are removed leaving only thermally grown oxide layer 12. Photoresist layer 11 is deposited over oxide 12 and apertured in a conventional manner where region 10 is desired. Using apertured photoresist layer 11 as an ion implantation mask and oxide layer 12 as an ion implantation screen, region 10 is implanted with N conductivity type impurity ions to produce an impurity concentration of about $5 \times 10^{16}$ atoms per cubic centimeter in region 10. State-of-the-art ion implantation techniques may be employed. One known method is disclosed in U.S. Pat. No. 3,388,009 issued June 11, 1968 to W. J. King for Method of Forming a P-N Junction by an Ionic Beam.

Figure 2:
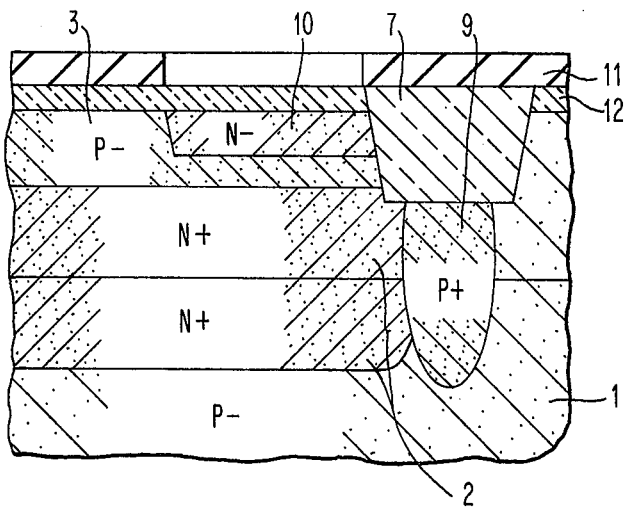
FIG. 2 is a cross-sectional view of the structure of FIG. 1 at an intermediate process step.
Figure 3:
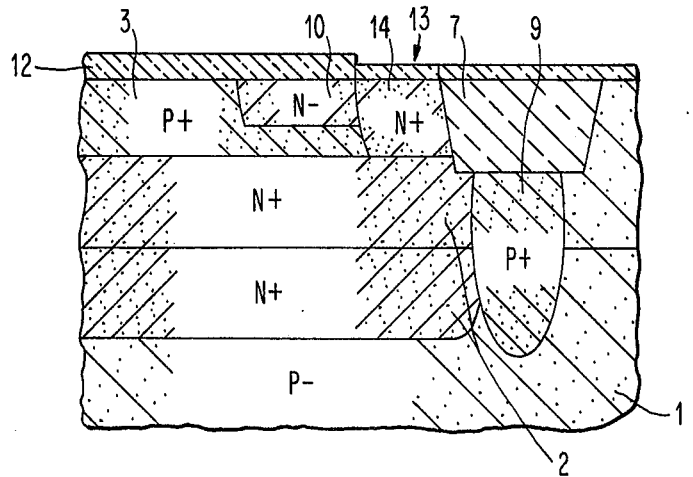
FIG. 3 is a cross-sectional view of the structure of FIG. 1 at a latter intermediate process step.

Following the ion implantation, the photoresist layer 11 of FIG. 2 is removed and a window is opened in region 13 of oxide layer 12 for the diffusion of $N^+$ reach-through region 14 extending through epitaxial layer 3 and reaching $N^+$ subcollector 2. Upon completion of the reach-through diffusion, the structure is subjected to reoxidation and sintering to yield the intermediate device shown in FIG. 3. The structure is completed as shown in FIG. 1 by masking and diffusion steps providing N+ emitter region 15 having a sheet resistivity of about 15 ohms per square. Preferably, emitter 15 is diffused to a depth of about 0.5 microns which, together with the out-diffusion of N+ subcollector 2 into epi layer 3 leaves a net base width of about 0.5 microns of P− material between emitter 15 and subcollector 2. Finally, emitter contact 16, base and Schottky contact 17 and collector contact 18 are provided. Aluminum is a suitable contact material.

Contact 17 establishes ohmic contact directly with P− epitaxial layer 3 which provides the base 19 of the NPN bipolar transistor formed in the recessed oxide isolated region. Contact 17 also establishes a Schottky barrier contact with the N− ion implanted region 10. The negative pole of the Schottky diode is ohmicly connected to the collector of the bipolar transistor by the connection of N− region 10 directly to the N+ reach-through region 14 which, in turn, contacts subcollector 2. It is to be noted that the desired Schottky diode along with its necessary connections to the base and collector regions of the bipolar transistor are established by the addition of process compatible steps for the ion implantation of region 10 to the existing recessed oxide isolated P epi-base transistor process.

Although disclosed in the preferred embodiment, the use of recessed dielectric isolation and the nitride oxidation masking the layer is optional in accordance with technology requirements. Other suitable isolation techniques, such as diffusion isolation will occur to those skilled in the art.

While the invention has been particularly shown and described with reference to the preferred embodiment thereof, it will be understood by those skilled in the art that various changes in form and details may be made therein without departing from the spirit and scope of the invention.

What is claimed is:
1. A Schottky diode clamped transistor comprising:
   a heavily doped first layer of a first impurity type forming the collector of said transistor,
   a lightly doped second layer of the other conductivity type over said first layer and forming the base of said transistor,
   a heavily doped first region of said first conductivity type in the surface of said second layer and forming the emitter of said transistor,
   a lightly doped second region of said first conductivity type in said surface of said second layer and separated from said first region,
   a heavily doped reach-through region of said first conductivity type extending through said second layer and connecting said second region to said first layer, and
   a contacting member on the surface of said second layer and extending across the boundary of said second region to establish ohmic contact with said second layer outside said second region and Schottky barrier contact with said second layer inside said second region.
2. The transistor defined in claim 1 wherein said first impurity type is N type.
3. The transistor defined in claim 2 wherein said contacting member is aluminum.
4. The transistor defined in claim 1 wherein said first layer extends across the boundary of a substrate and an epitaxial layer and said second layer is within said epitaxial layer.
5. The transistor defined in claim 1 wherein the impurity concentration of said second layer is about $10^{16}$ atoms per cubic centimeter.
6. The transistor defined in claim 5 wherein the impurity concentration of said second region is about $5 \times 10^{16}$ atoms per cubic centimeter.
7. The transistor defined in claim 1 wherein said second region is ion implanted.

* * * * *